United States Patent
Chin

(10) Patent No.: US 10,117,322 B2
(45) Date of Patent: Oct. 30, 2018

(54) CIRCUIT ASSEMBLY AND ELECTRIC JUNCTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Chuo-ku, Osaka-shi, Osaka (JP)

(72) Inventor: Tou Chin, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/308,859

(22) PCT Filed: May 11, 2015

(86) PCT No.: PCT/JP2015/063433
§ 371 (c)(1),
(2) Date: Nov. 4, 2016

(87) PCT Pub. No.: WO2015/178232
PCT Pub. Date: Nov. 26, 2015

(65) Prior Publication Data
US 2017/0079129 A1 Mar. 16, 2017

(30) Foreign Application Priority Data
May 23, 2014 (JP) ................. 2014-106803

(51) Int. Cl.
*H05K 1/02* (2006.01)
*H05K 1/18* (2006.01)
(Continued)

(52) U.S. Cl.
CPC ........... *H05K 1/0204* (2013.01); *B60R 16/02* (2013.01); *H05K 1/181* (2013.01);
(Continued)

(58) Field of Classification Search
CPC ............ H05K 7/2039; H05K 7/20454; H05K 7/20463; H05K 7/20472; H05K 7/205; H05K 1/0201–1/0206
USPC ............... 361/704, 709, 711, 713, 719, 720; 165/80.1, 80.2
See application file for complete search history.

(56) References Cited

U.S. PATENT DOCUMENTS 5,708,566 A * 1/1998 Hunninghaus ....... H05K 1/0206
174/252
6,156,980 A * 12/2000 Peugh ................. H01L 23/3677
174/252
(Continued)

FOREIGN PATENT DOCUMENTS

| JP | 2003164039 A | 6/2003 |
|---|---|---|
| JP | 2003179316 A | 6/2003 |

(Continued)

OTHER PUBLICATIONS

International Search Report dated Jul. 21, 2015 pertaining to International Application No. PCT/JP2015/063433.

*Primary Examiner* — Dion R Ferguson
*Assistant Examiner* — Amir Jalali
(74) *Attorney, Agent, or Firm* — Honigman Miller Schwartz and Cohn LLP

(57) ABSTRACT

Provided is a circuit assembly including a heatsink, an insulating sheet that is placed on the heatsink, and a circuit board that is placed on the heatsink via the insulating sheet. The circuit board is fixed to the heatsink by screwing, and a heat conductive member is arranged between insulating sheet and the circuit board.

7 Claims, 8 Drawing Sheets

(51) Int. Cl.
  *H05K 7/20* (2006.01)
  *B60R 16/02* (2006.01)
  *H02G 3/16* (2006.01)

(52) U.S. Cl.
  CPC .......... *H05K 7/20854* (2013.01); *H02G 3/16* (2013.01); *H05K 2201/066* (2013.01)

(56) References Cited

U.S. PATENT DOCUMENTS

| | | | | |
|---|---|---|---|---|
| 6,201,696 | B1* | 3/2001 | Shimizu | H01L 23/24 165/80.2 |
| 6,529,380 | B1* | 3/2003 | Kono | H01L 23/3735 257/707 |
| 6,549,409 | B1* | 4/2003 | Saxelby, Jr. | H05K 1/0203 165/185 |
| 6,724,631 | B2* | 4/2004 | Ye | H01L 23/36 257/707 |
| 7,535,174 | B2* | 5/2009 | Shin | H05K 7/20963 313/36 |
| 7,643,297 | B2* | 1/2010 | Tominaga | B62D 5/0406 165/80.2 |
| 7,791,888 | B2* | 9/2010 | Tominaga | B60R 16/0239 165/185 |
| 8,520,389 | B2* | 8/2013 | Rozman | H01L 23/24 361/709 |
| 8,737,073 | B2* | 5/2014 | Yeh | H05K 1/0203 174/260 |
| 8,737,075 | B2* | 5/2014 | Yamashita | B23K 1/0016 174/252 |
| 9,320,178 | B2* | 4/2016 | Oota | H05K 7/20854 |
| 2003/0137813 | A1 | 7/2003 | Onizuka et al. | |
| 2010/0246139 | A1 | 9/2010 | Suzuki et al. | |
| 2013/0003306 | A1* | 1/2013 | Oota | B60R 16/0239 361/709 |

FOREIGN PATENT DOCUMENTS

| | | |
|---|---|---|
| JP | 2005151624 A | 6/2005 |
| JP | 2010232318 A | 10/2010 |

* cited by examiner

CIRCUIT ASSEMBLY AND ELECTRIC JUNCTION BOX

CROSS-REFERENCE TO RELATED APPLICATIONS

This application is the U.S. national stage of PCT/JP2015/063433 filed May 11, 2015, which claims priority of Japanese Patent Application No. JP 2014-106803 filed May 23, 2014.

FIELD OF THE INVENTION

A technique disclosed in the present description relates to a circuit assembly and an electric junction box.

BACKGROUND

Conventionally, devices in which a circuit assembly provided with a circuit board on which various electronic components are mounted is accommodated in a case are known as devices for energizing and de-energizing in-car electric components.

In such devices, the electronic components mounted on the circuit board generate a relatively large amount of heat, and thus if heat generated by the electronic components stays in the case, the temperature in the case will increase, causing a risk that the performance of the electronic components accommodated in the case will decrease.

Accordingly, various structures for discharging the heat generated by the circuit board or the electronic components have conventionally been proposed. For example, a circuit assembly has been proposed that has a configuration in which a metal heat discharging member is provided on that surface of a circuit board that faces away from the surface on which electronic components are arranged.

The circuit board and the heat discharging member are bonded to each other, by first providing, on one surface side of the heat discharging member, an insulating layer for insulating the heat discharging member from the circuit board, and then spreading an adhesive having high heat conductivity on the insulating layer.

There is a method in which, for example, a thermosetting adhesive is applied to the upper surface of the heat discharging member, and is heated so as to form an insulating thin film that serves as the above-described insulating layer.

However, the method in which a thermosetting adhesive is applied and hardened to form an insulating layer needs a large-scaled device, and incurs a manufacturing cost. Therefore, a method has been considered that uses an adhesive that can be hardened at room temperature, but such an adhesive cannot be used in processes such as printing or spraying since it is hardened at room temperature with time, and it is difficult to form a uniform layer for achieving reliable insulation.

Alternatively, it is also conceivable that an insulating sheet that has adhesion on both sides thereof is used to achieve both insulation and adhesion between the heatsink and the circuit board, but it is difficult to bond the circuit board to the heat discharging member in a uniform state because uniformly applying a constant pressure to the circuit board on which the electronic components are mounted is difficult.

The technique disclosed in the present description was made in view of the above-described circumstances, and it is an object thereof to provide a circuit assembly and an electrical junction box that have a low manufacturing cost, and are superior in heat discharge performance.

SUMMARY OF INVENTION

According to the technique disclosed in the present description, a circuit assembly includes: a heatsink; an insulating sheet that is placed on the heatsink; and a circuit board that is placed on the heatsink via the insulating sheet, wherein the circuit board is fixed to the heatsink by a fixing member, and a heat conductive member is arranged between the insulating sheet and the circuit board.

According to such a configuration, insulation between the heatsink and the circuit board is first ensured by the insulating sheet. Furthermore, the heatsink and the circuit board are fixed to each other by the fixing member.

At this time, a gap may be created between the heatsink and the circuit board, and in such a case, there is a risk that heat conductivity will decrease. However, since the technique disclosed in the present description has a configuration in which the heat conductive member is arranged between the heatsink and the circuit board, and the heat conductive member is in intimate contact with the heatsink and the circuit board, heat generated by the circuit board is immediately transferred to the heatsink by the heat conductive member, and is discharged.

Furthermore, when an electronic component is mounted on a surface of the circuit board that faces away from a side on which the heatsink is arranged, a configuration is also possible in which the heat conductive member is provided in a region that corresponds to a region of the circuit board on which the electronic component is mounted. Such a configuration makes it possible to achieve a high heat discharge effect while reducing the amount of use of the heat conductive member.

Furthermore, the technique disclosed in the present description relates to an electric junction box in which the circuit assembly is accommodated in a case.

According to the technique disclosed in the present description, it is possible to achieve a circuit assembly and an electrical junction box that have a low manufacturing cost, and are superior in heat discharge performance.

DETAILED DESCRIPTION OF THE PREFERRED EMBODIMENTS

An embodiment will be described with reference to FIGS. 1 to 7.

Figure 5:
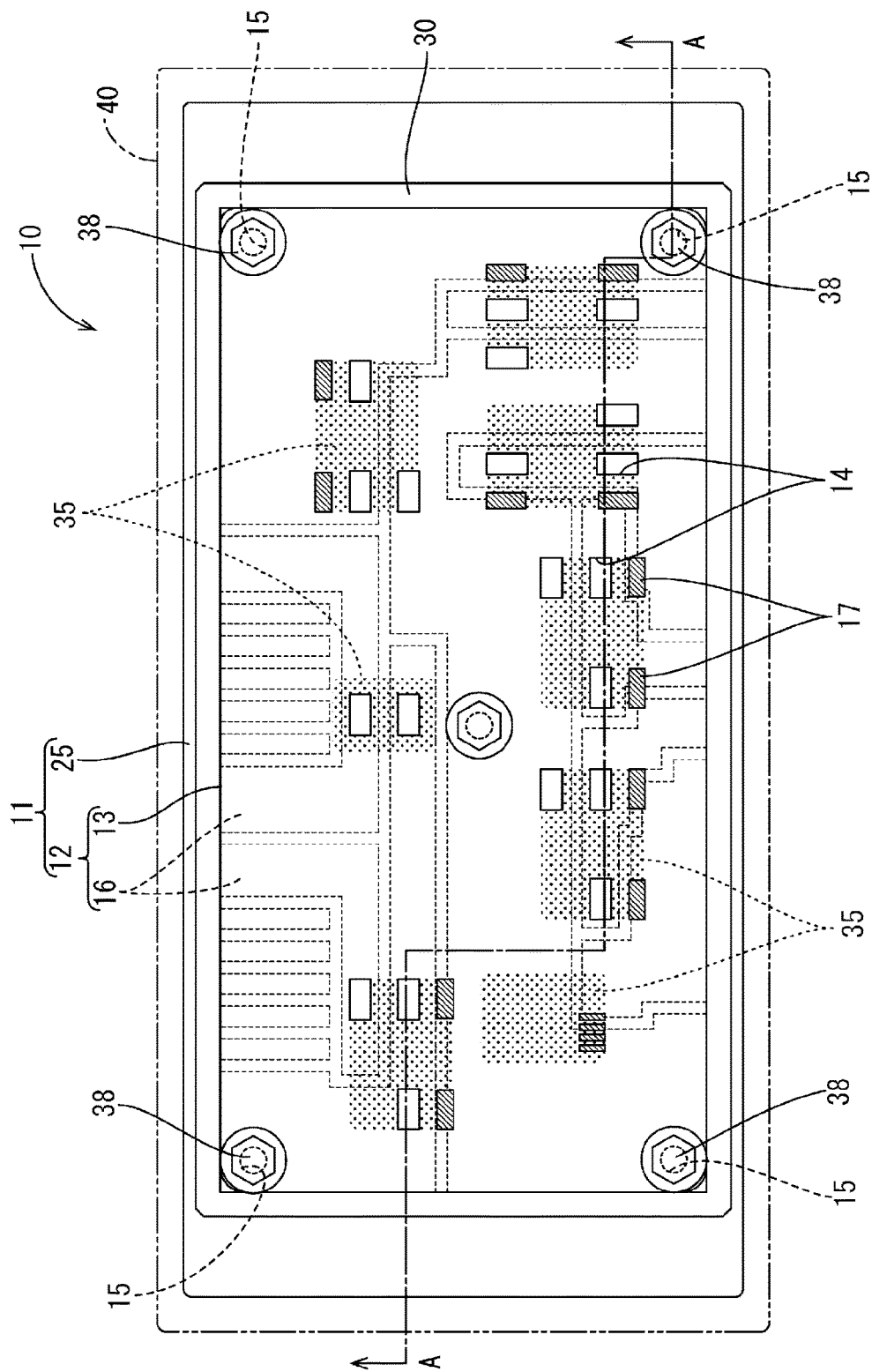
FIG. 5 is a plan view illustrating a circuit assembly without electronic components.
Figure 6:
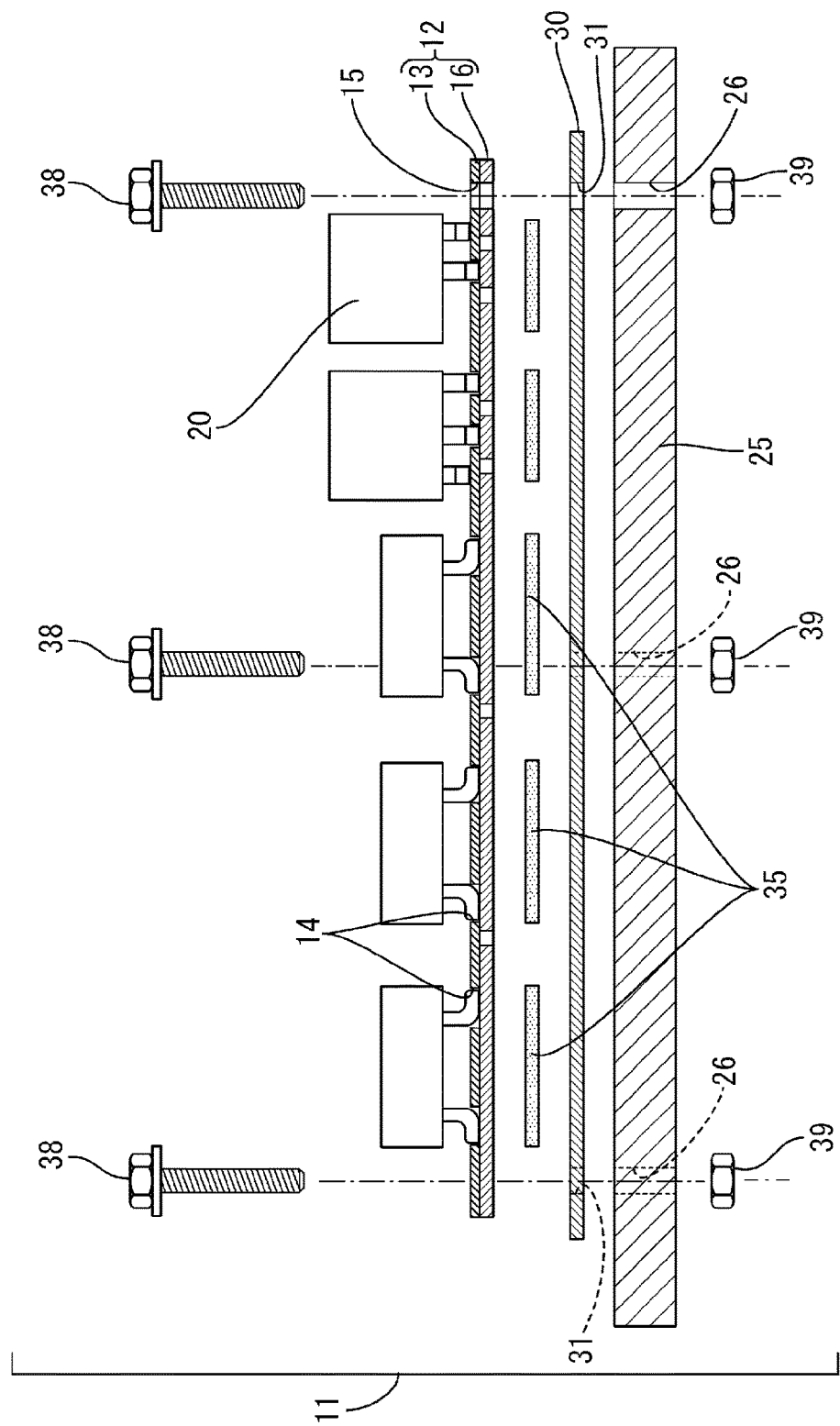
FIG. 6 is an exploded cross-sectional view taken along a line A-A of FIG. 5.

An electric junction box 10 of the present embodiment is provided with a circuit assembly 11 including a circuit board 12 and a heatsink 25, and a synthetic resin case 40 that accommodates the circuit assembly 11 (see FIG. 5). Note that in the following description, the upper side of FIG. 7 refers to "front side" or "upper side", and the lower side of FIG. 7 refers to "rear side" or "lower side".

Figure 7:
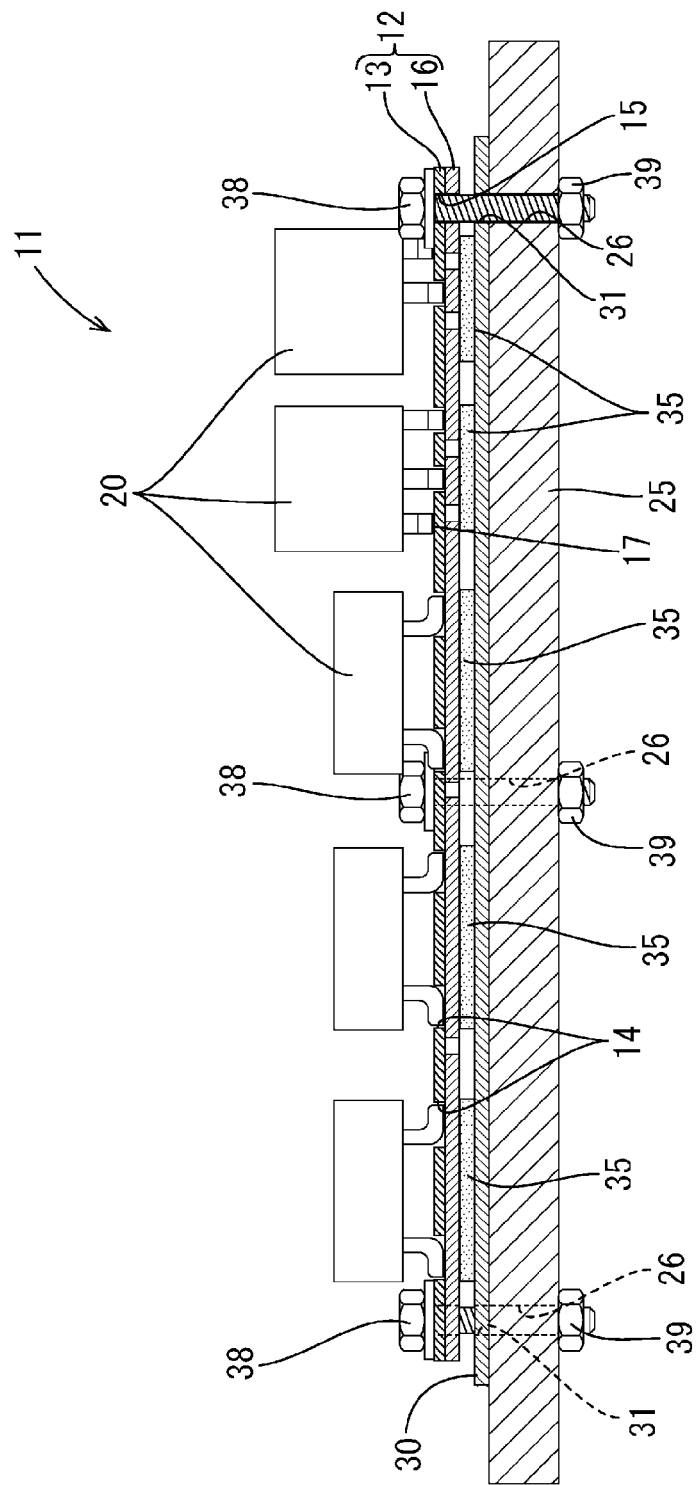
FIG. 7 is a cross-sectional view taken along the line A-A of FIG. 5.

As shown in FIG. 7, the circuit assembly 11 is provided with the circuit board 12, electronic components 20 arranged on the front surface (upper surface in FIG. 1) of the circuit board 12, and the heatsink 25 arranged on the rear surface (lower surface in FIG. 1) of the circuit board 12.

As shown in FIG. 5, the circuit board 12 is rectangular, and has a configuration in which a conductive circuit (not shown) is formed on the front surface of an insulating substrate 13 by printed wiring, and a plurality of busbars 16 are arranged on the rear surface of the insulating substrate 13 in a predetermined pattern. The plurality of busbars 16 are substantially rectangular, and are formed by pressing a metal plate material into predetermined shapes. The circuit board 12 has, at four corners and the center thereof, substrate fixing holes 15 through which bolts 38 (an example of the fixing member) for fixing the circuit board 12 to the heatsink 25 are respectively passed.

The electronic components 20 such as relays are arranged on the front surface of the circuit board 12. As shown in FIGS. 5 and 7, the insulating substrate 13 has, at positions thereof at which the electronic components 20 are arranged, connection openings 14 for use in mounting the electronic components 20 on the busbars 16, and lead terminals of the electronic components 20 are electrically connected to lands 17 of the conductive circuit or the front surfaces of the busbars 16 that are exposed via the connection openings 14 by, for example, a well-known method such as soldering.

The heatsink 25 is arranged on the lower surface side (rear surface side) of the busbars 16 of the circuit board 12 (see FIG. 7). The heatsink 25 is a plate-shaped member made of a metal material such as aluminum or an aluminum alloy that is excellent in heat conductivity, and has the function to discharge heat generated by the circuit board 12 and the electronic components 20. The heatsink 25 has heatsink fixing holes 26 at positions of the heatsink 25 that correspond to the above-described substrate fixing holes 15.

An insulating sheet 30 for insulating the heatsink 25 from the circuit board 12 (busbars 16) is overlapped with the upper surface of the heatsink 25. The insulating sheet 30 has a size that is somewhat smaller than the upper surface of the heatsink 25, and has such adhesion that it is fixable to the heatsink 25. Furthermore, the insulating sheet 30 has, at positions thereof that correspond to the heatsink fixing holes 26, sheet fixing holes 31 that penetrate the insulating sheet 30.

Furthermore, heat conductive members 35 (see FIGS. 5 and 7) are arranged between the insulating sheet 30 and the regions of the busbars 16 that correspond to the electronic components 20. In the present embodiment, the heat conductive members 35 are, for example, an adhesive having viscosity.

The following will describe an example of processes for manufacturing an electric junction box 10 according to the present embodiment. First, solder is applied by screen printing to predetermined positions on the upper surface of the circuit board 12, which has a front surface on which the conductive circuit is formed by printed wiring and a rear surface on which the busbars 16 are arranged in a predetermined pattern. Then, the electronic components 20 are placed at the predetermined positions, and reflow soldering is carried out. Accordingly, a state is achieved in which the electronic components 20 are mounted on the front surface side of the circuit board 12 (see FIG. 6).

Figure 1:
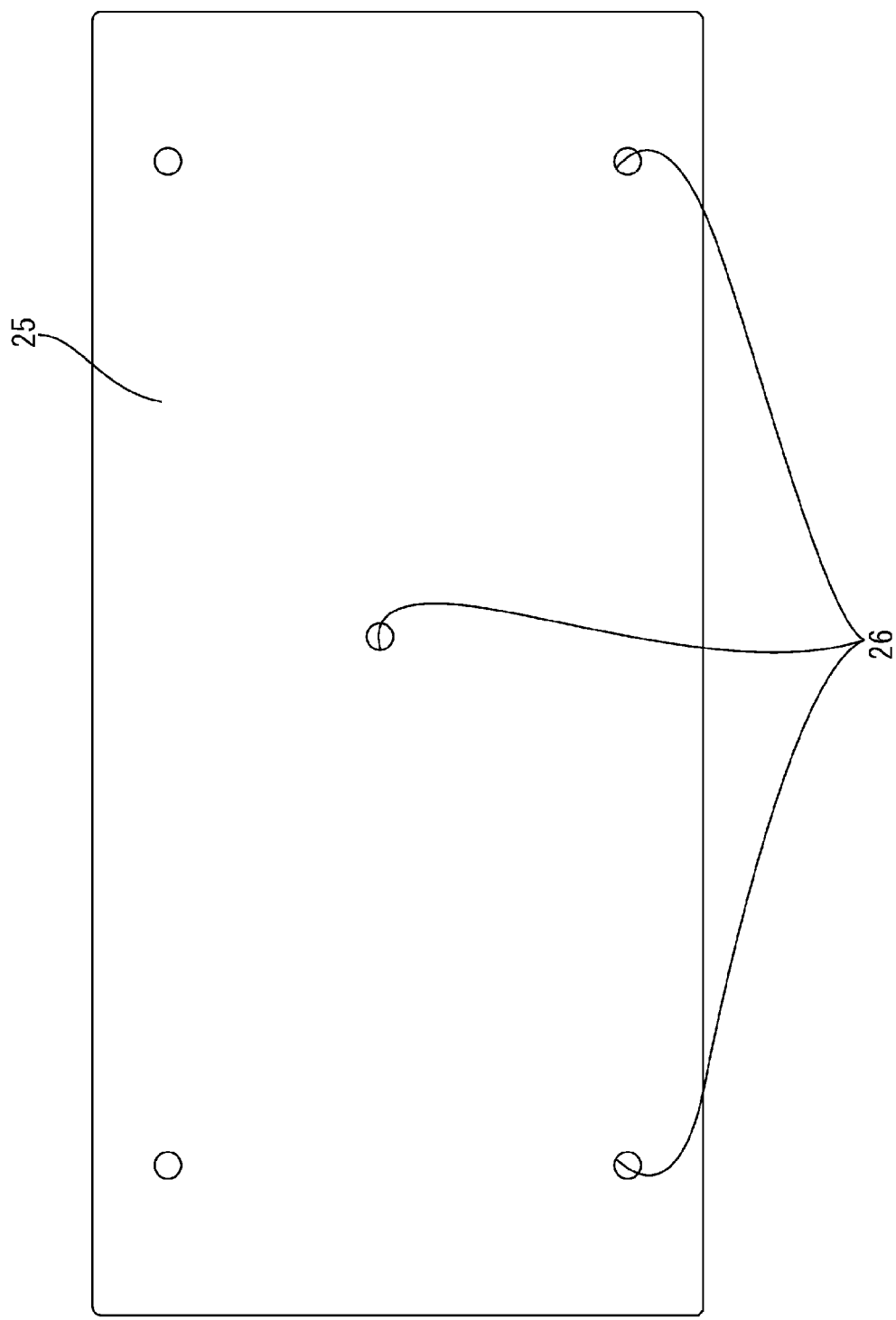
FIG. 1 is a plan view illustrating a heatsink according to an embodiment.
Figure 2:
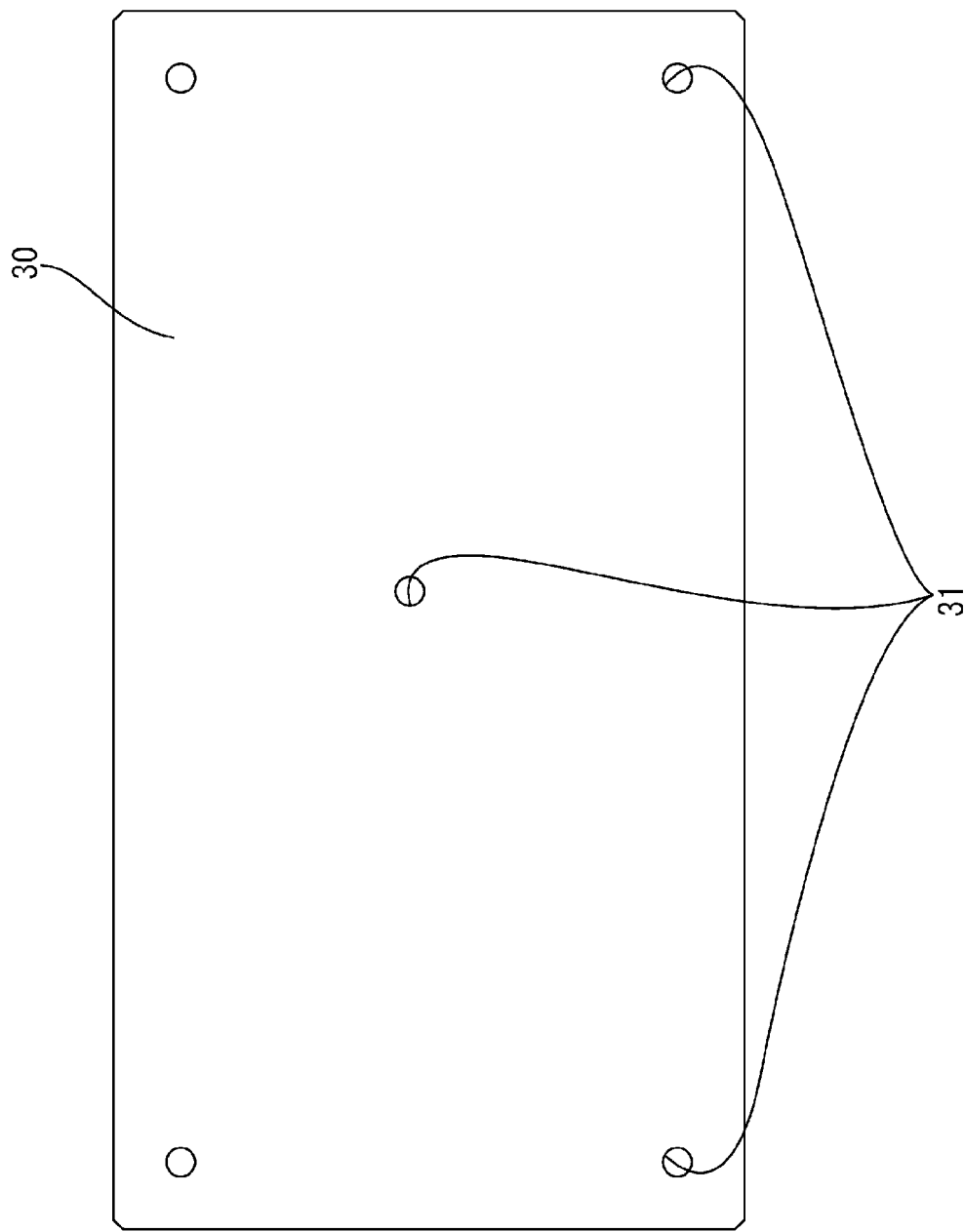
FIG. 2 is a plan view illustrating an insulating sheet
Figure 3:
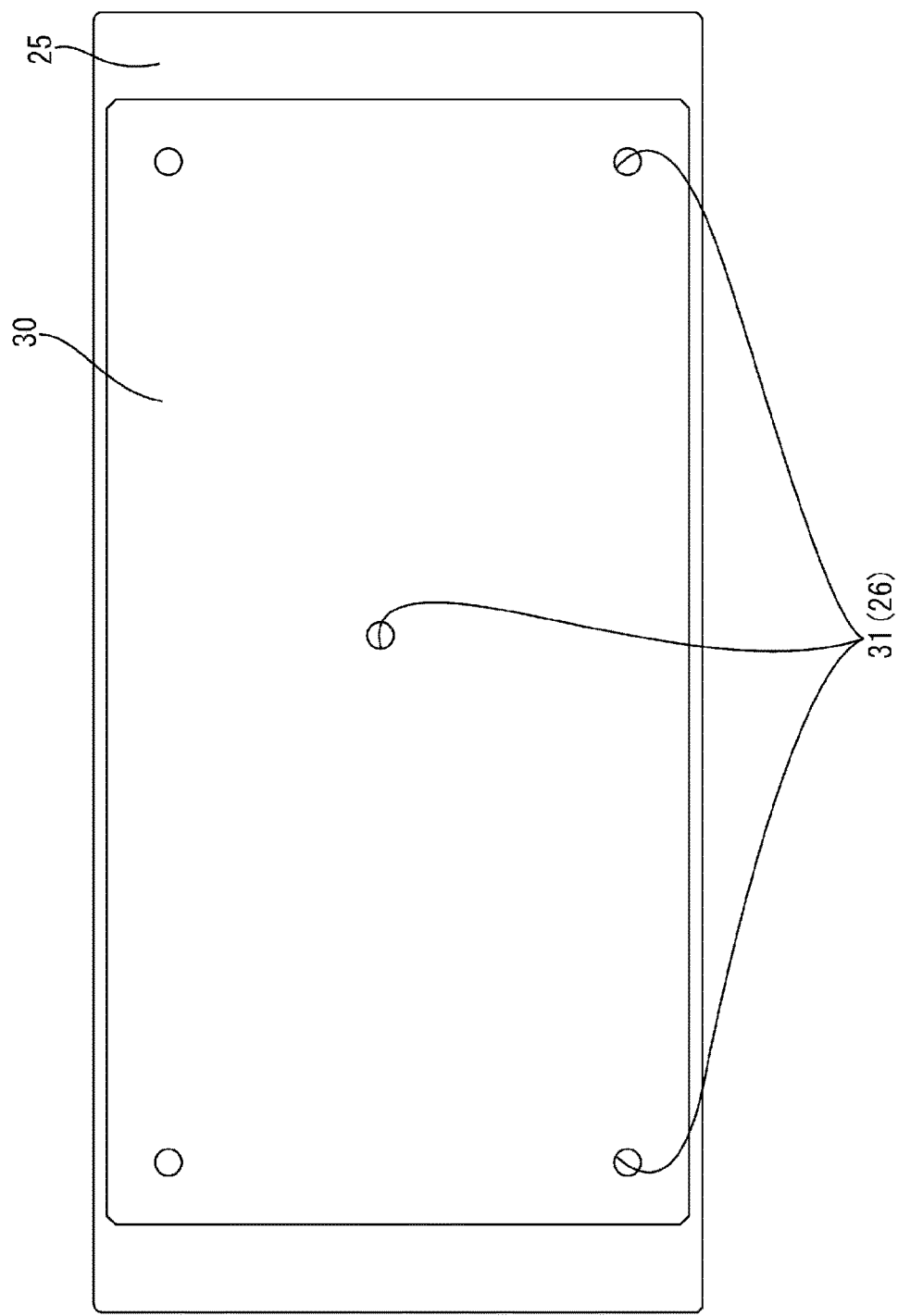
FIG. 3 is a plan view illustrating a state in which the insulating sheet is overlapped with the heatsink.
Figure 4:
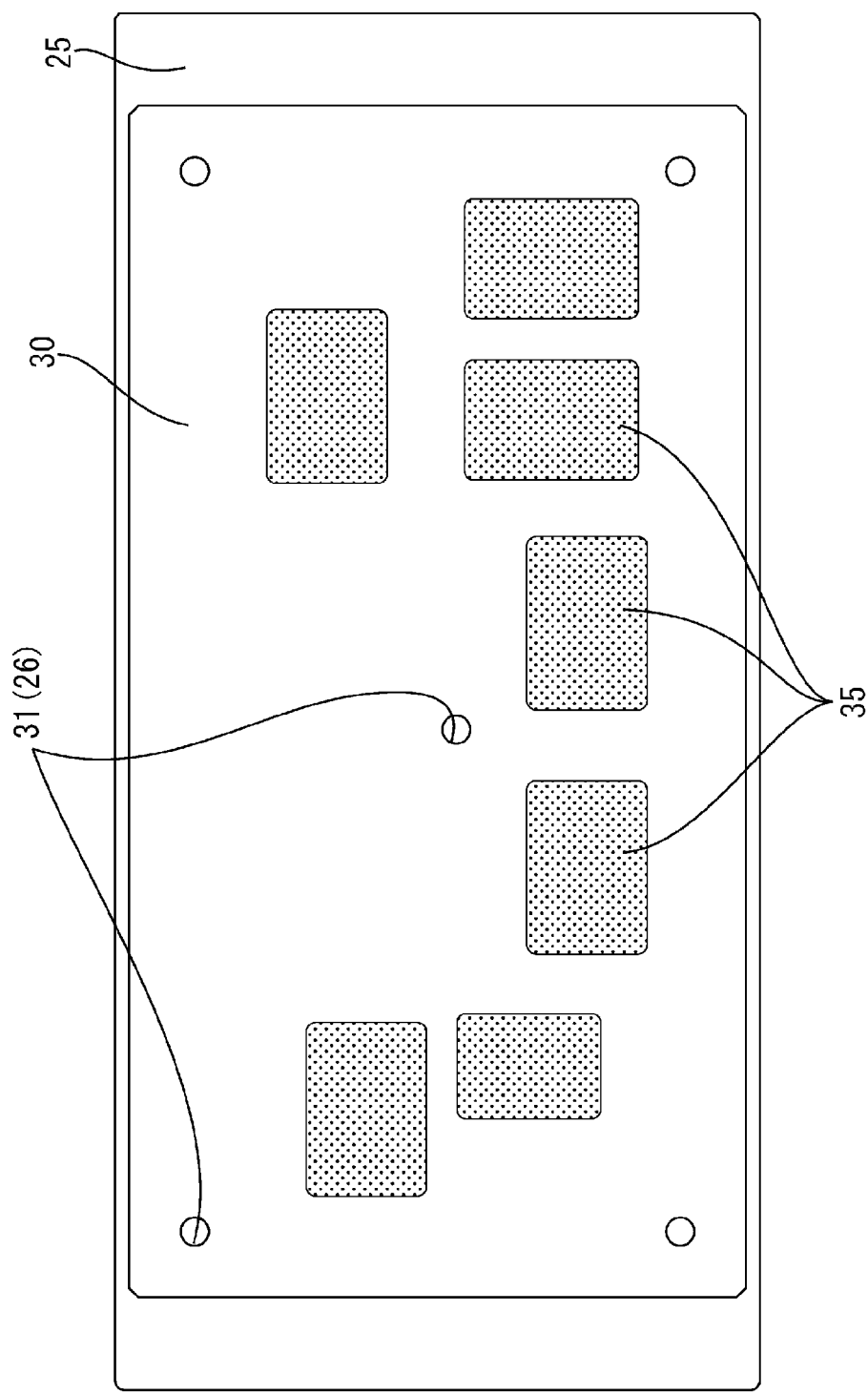
FIG. 4 is a plan view illustrating a state in which heat conductive members are overlapped with the insulating sheet.

Then, the insulating sheet 30 is placed on the upper surface of the heatsink 25, and the insulating sheet 30 and the heatsink 25 are entirely pressed against each other so as to be in intimate contact with and fixed to each other (see FIG. 3). Then, the heat conductive members 35 are applied to the regions of the insulating sheet 30 that correspond to the electronic components 20 when the circuit board 12 is overlapped (see FIG. 4), and then the circuit board 12 on which the electronic components 20 are mounted is laid thereon from above. At this time, the heat conductive members 35 are extended so as to be squished between the lower surface of the circuit board 12 (busbars 16) and the upper surface of the insulating sheet 30, and are brought into intimate contact with both components.

Then, the bolts 38 are passed through the substrate fixing holes 15, the sheet fixing holes 31, and the heatsink fixing holes 26 that are in communication with each other, and are fastened with nuts 39 (an example of the fixing member). Accordingly, the circuit assembly 11 in which the circuit board 12 and the heatsink 25 are fixed to each other is achieved (see FIGS. 5 to 7). Note that in FIG. 5, the mounted electronic components 20 are omitted in order that the positional relationship between the heat conductive members 35, and the connection openings 14 and the lands 17 is made clear.

Lastly, the circuit assembly 11 is accommodated in the case 40, and the electric junction box 10 is obtained.

The following will describe the functions and effects of the circuit assembly 11 and the electric junction box 10 according to the present embodiment. According to the circuit assembly 11 and the electric junction box 10 of the present embodiment, insulation between the heatsink 25 and the circuit board 12 (busbars 16) is ensured by the insulating sheet 30. Accordingly, it is possible to manufacture the circuit assembly 11 and the electric junction box 10 inexpensively as compared to the conventional configuration in which an insulating layer is made of a thermosetting resin and that incurs a manufacturing cost.

Furthermore, the heatsink 25 and the circuit board 12 have a configuration in which they are fixed to each other by fastening the bolts 38 with the nuts 39. At this time, a gap may be created between the heatsink 25 and the circuit board 12, which are both plate-shaped, and in such a case, there is a risk that heat conductivity will decrease. However, according to the present embodiment, since the heat conductive members 35 are arranged between the heatsink 25 and the circuit board 12, and are in intimate contact with both the heatsink 25 and the circuit board 12, heat generated by the circuit board 12 is immediately transferred to the heatsink 25 by the heat conductive members 35, and is discharged.

Moreover, as described above, since the heatsink 25 and the circuit board 12 are fixed to each other by fastening the bolts 38 with the nuts 39, the heat conductive members 35 do not necessarily have adhesion, and it is easy to select a material.

Furthermore, since a configuration is realized in which the heat conductive members 35 are provided only in regions that correspond to the regions of the circuit board 12 on which the electronic components 20 are mounted, it is possible to immediately transfer heat generated by the electronic components 20 to the heatsink 25 while reducing the amount of use of the heat conductive members 35, achieving a high heat discharge effect.

In other words, it is possible to achieve the circuit assembly 11 and the electric junction box 10 that have a low manufacturing cost, and are superior in heat discharge performance.

OTHER EMBODIMENTS

The technique disclosed in the present description is not limited to the embodiment explained in the description with reference to the drawing, and encompasses various modifications as will be described below, for example.

Figure 8:
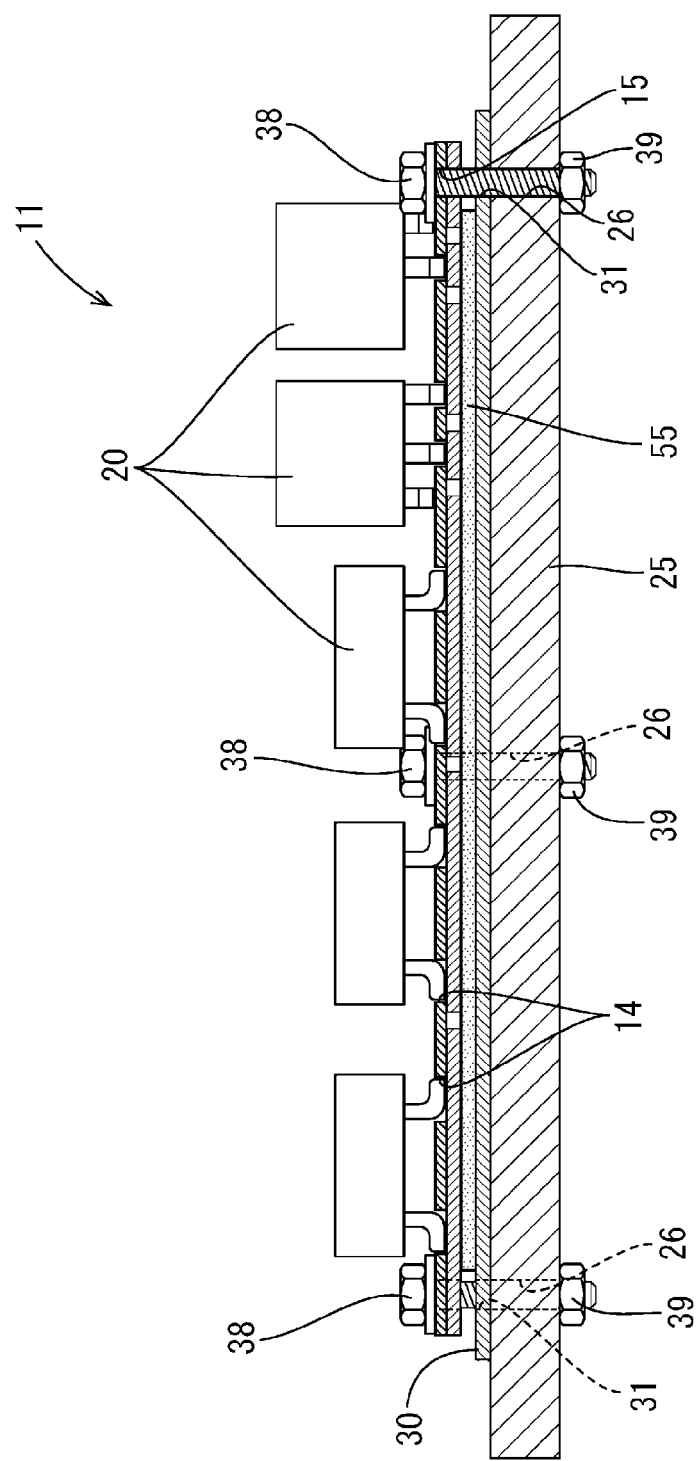
FIG. 8 is a lateral cross-sectional view of a circuit assembly according to another embodiment.

(1) The above-described embodiment has a configuration in which the heat conductive members 35 are provided only at the positions that correspond to the electronic components 20, but as shown in FIG. 8, a configuration is also possible in which a heat conductive member 55 is provided over the entire upper surface of the heatsink 25.

(2) In the above-described embodiment, the heat conductive members 35 are an adhesive that has adhesion, but another member (such as a gel-like sheet) may be used as long as it easily deforms and comes into intimate contact with the circuit board 12 (busbars 16) and the insulating sheet 30 so as to fill up a gap therebetween. Thus, the heat conductive members 35 are not limited to those of the above-described embodiment.

(3) The positions of the bolts 38 for fixing the circuit board 12 to the heatsink 25 are not limited to those in the above-described embodiment, and the bolts 38 may be provided at other positions according to the rigidity of the circuit board 12. Furthermore, the number of bolts 38 is also not limited to that of the above-described embodiment.

The invention claimed is:

1. A circuit assembly comprising:
a heatsink;
an insulating sheet disposed on the heatsink; and
a circuit board spaced apart from the heat sink, wherein the insulating sheet is disposed between the circuit board and the heat sink,
wherein the circuit board is fixed to the heatsink by a fixing member, and
a plurality of heat conductive members formed of viscous material and is disposed on the insulating sheet so as to be pressed between the insulating sheet and the circuit board and form a continuous planar surface, each of the plurality of heat conductive members being spaced a part from each other so as to form a gap.

2. The circuit assembly according to claim 1,
wherein a plurality of electronic components are mounted on a surface of the circuit board that faces away from a side on which the heatsink is arranged, and
wherein each of the plurality of the heat conductive members is provided in a region that corresponds to a region of the circuit board on which a corresponding one of the plurality the electronic components is mounted.

3. The circuit assembly according to claim 2,
wherein the region of the circuit board on which the corresponding one of the plurality of electronic components is mounted is provided between one and another of lead terminals of the plurality of electronic components.

4. An electric junction box in which the circuit assembly according to claim 3 is accommodated in a case.

5. An electric junction box in which the circuit assembly according to claim 2 is accommodated in a case.

6. An electric junction box in which the circuit assembly according to claim 1 is accommodated in a case.

7. The circuit assembly according to claim 1, wherein the plurality of heat conductive members is an adhesive.

* * * * *